(12) United States Patent
Hung

(10) Patent No.: US 11,460,495 B2
(45) Date of Patent: Oct. 4, 2022

(54) MEASUREMENT CIRCUIT AND METHOD FOR MEASURING CHARACTERISTIC OF PASSIVE COMPONENT BY MEANS OF COMPARISON SIGNALS

(71) Applicant: Egis Technology Inc., Hsinchu (TW)

(72) Inventor: Tzu-Li Hung, Hsinchu County (TW)

(73) Assignee: Egis Technology Inc., Hsinchu (TW)

( * ) Notice: Subject to any disclaimer, the term of this patent is extended or adjusted under 35 U.S.C. 154(b) by 123 days.

(21) Appl. No.: 17/177,218

(22) Filed: Feb. 17, 2021

(65) Prior Publication Data

US 2021/0341525 A1 Nov. 4, 2021

Related U.S. Application Data

(60) Provisional application No. 63/017,672, filed on Apr. 30, 2020.

(30) Foreign Application Priority Data

Nov. 12, 2020 (CN) .......................... 202011263562.7

(51) Int. Cl.
*G01R 27/26* (2006.01)
*H03K 5/24* (2006.01)
(Continued)

(52) U.S. Cl.
CPC ......... *G01R 27/26* (2013.01); *G01R 27/2605* (2013.01); *H03K 5/24* (2013.01); *G06F 3/044* (2013.01); *G06F 3/045* (2013.01)

(58) Field of Classification Search
CPC ........ G01R 27/00; G01R 27/02; G01R 27/26; G01R 27/2605; G01R 31/00; G01R 31/26;
(Continued)

(56) References Cited

U.S. PATENT DOCUMENTS

2011/0115717 A1* 5/2011 Hable ................. G06F 3/04184
345/173
2012/0154957 A1* 6/2012 Williams ................. H02H 1/06
702/65

(Continued)

FOREIGN PATENT DOCUMENTS

CN 102047563 A 5/2011
CN 102725715 A 10/2012
(Continued)

*Primary Examiner* — Hoai-An D. Nguyen
(74) *Attorney, Agent, or Firm* — Winston Hsu

(57) ABSTRACT

A circuit for measuring a passive component includes a first comparator, a second comparator, a third comparator and a counter. The first comparator compares a first voltage and a first reference voltage to generate a first comparison signal. The second comparator compares a second voltage and a second reference voltage to generate a second comparison signal. The third comparator compares a third voltage and a third reference voltage to generate a third comparison signal. The counter counts the number of pulses according to the third comparison signal. The number of pulses corresponds to time for the third voltage to drop to the third reference voltage, and the first comparison signal and the second comparison signal are used to control the drop of the third voltage.

20 Claims, 4 Drawing Sheets

(51) Int. Cl.
*G06F 3/044* (2006.01)
*G06F 3/045* (2006.01)

(58) Field of Classification Search
CPC ... G01R 31/2601; G01R 31/2607; G06F 3/00; G06F 3/01; G06F 3/03; G06F 3/041; G06F 3/0416; G06F 3/04166; G06F 3/044; G06F 3/045; G06K 9/00; G06K 9/00496; H03K 5/00; H03K 5/22; H03K 5/24
USPC .............................. 324/600, 649, 658, 679
See application file for complete search history.

(56) References Cited

U.S. PATENT DOCUMENTS

| | | | |
|---|---|---|---|
| 2017/0104421 A1* | 4/2017 | Chiu | .................. H02M 3/33507 |
| 2018/0260076 A1 | 9/2018 | Maharyta | |
| 2019/0123725 A1* | 4/2019 | Vulpoiu | .................... H03K 7/08 |
| 2020/0256928 A1* | 8/2020 | Tsutsumi | ................ G01R 31/64 |
| 2020/0366079 A1* | 11/2020 | Telefus | ................ G01R 15/202 |

FOREIGN PATENT DOCUMENTS

| | | |
|---|---|---|
| CN | 102763060 A | 10/2012 |
| TW | 201037582 A1 | 10/2010 |
| WO | 2019/084832 A1 | 5/2019 |

\* cited by examiner

MEASUREMENT CIRCUIT AND METHOD FOR MEASURING CHARACTERISTIC OF PASSIVE COMPONENT BY MEANS OF COMPARISON SIGNALS

CROSS REFERENCE TO RELATED APPLICATIONS

This application claims priority to U.S. patent application No. 63/017,672, filed Apr. 30, 2020, and incorporated herein by reference in its entirety. This application claims priority to China patent application number CN202011263562.7, filed Nov. 12, 2020, and incorporated herein by reference in its entirety.

BACKGROUND OF THE INVENTION

1. Field of the Invention

The application is related to a measurement circuit and a method for measuring a passive component, and more particularly, a measurement circuit and a method for measuring a characteristic of a passive component by means of comparison signals.

2. Description of the Prior Art

In electronic devices, there is often a need to measure the capacitance or resistance of passive components. For example, in capacitive or resistive touch devices, since the capacitance value or resistance value changes before and after the device is touched, it is possible to detect whether a touch has occurred by measuring the capacitance value or resistance value of the passive element.

However, it is a challenge to detect the capacitance or resistance of passive components. For example, if there is an unknown component under test, and the measurement cannot be performed directly from the two terminals of the device, it is not easy to obtain its capacitance value. Therefore, there is a lack of appropriate solutions in this field to effectively measure the changes of characteristics such as capacitance or resistance of passive components.

SUMMARY OF THE INVENTION

An embodiment provides a circuit for measuring a passive component including a first comparator, a second comparator, a third comparator and a counter. The first comparator is used to compare a first voltage and a first reference voltage to generate a first comparison signal. The second comparator is used to compare a second voltage and a second reference voltage to generate a second comparison signal. The third comparator is used to compare a third voltage and a third reference voltage to generate a third comparison signal. The counter is used to count number of pulses according to the third comparison signal. The number of pulses corresponds to time for the third voltage to drop to the third reference voltage, and the first comparison signal and the second comparison signal are used to control drop of the third voltage.

Another embodiment provides a method for measuring a passive component. The method includes comparing a first voltage and a first reference voltage to generate a first comparison signal; comparing a second voltage and a second reference voltage to generate a second comparison signal; comparing a third voltage and a third reference voltage to generate a third comparison signal; and counting a number of pulses according to the third comparison signal; wherein the number of pulses corresponds to time for the third voltage to drop to the third reference voltage, and the first comparison signal and the second comparison signal are used to control drop of the third voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
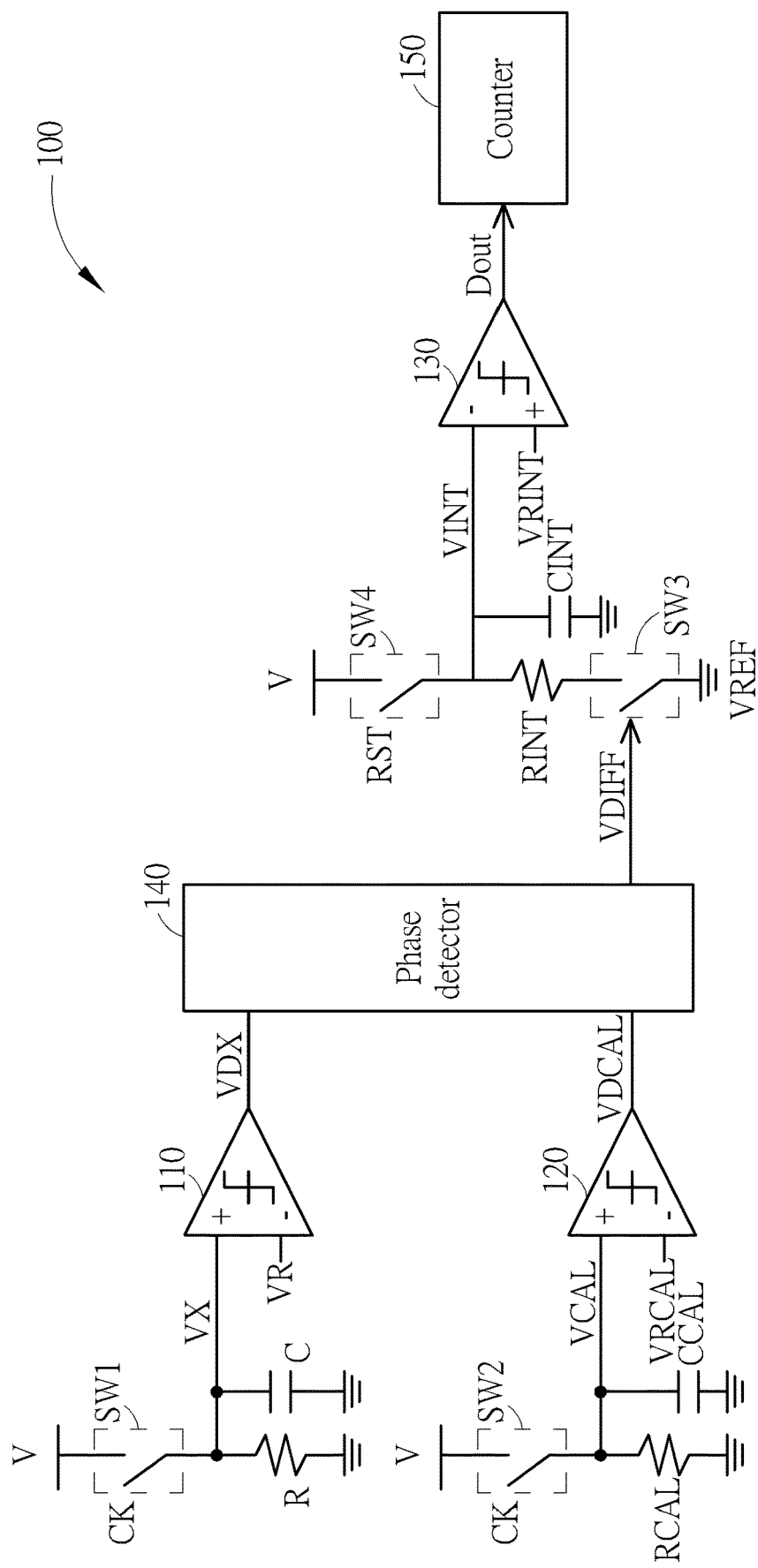
FIG. 1 illustrates a measurement circuit for measuring a passive component according to an embodiment.
Figure 2:
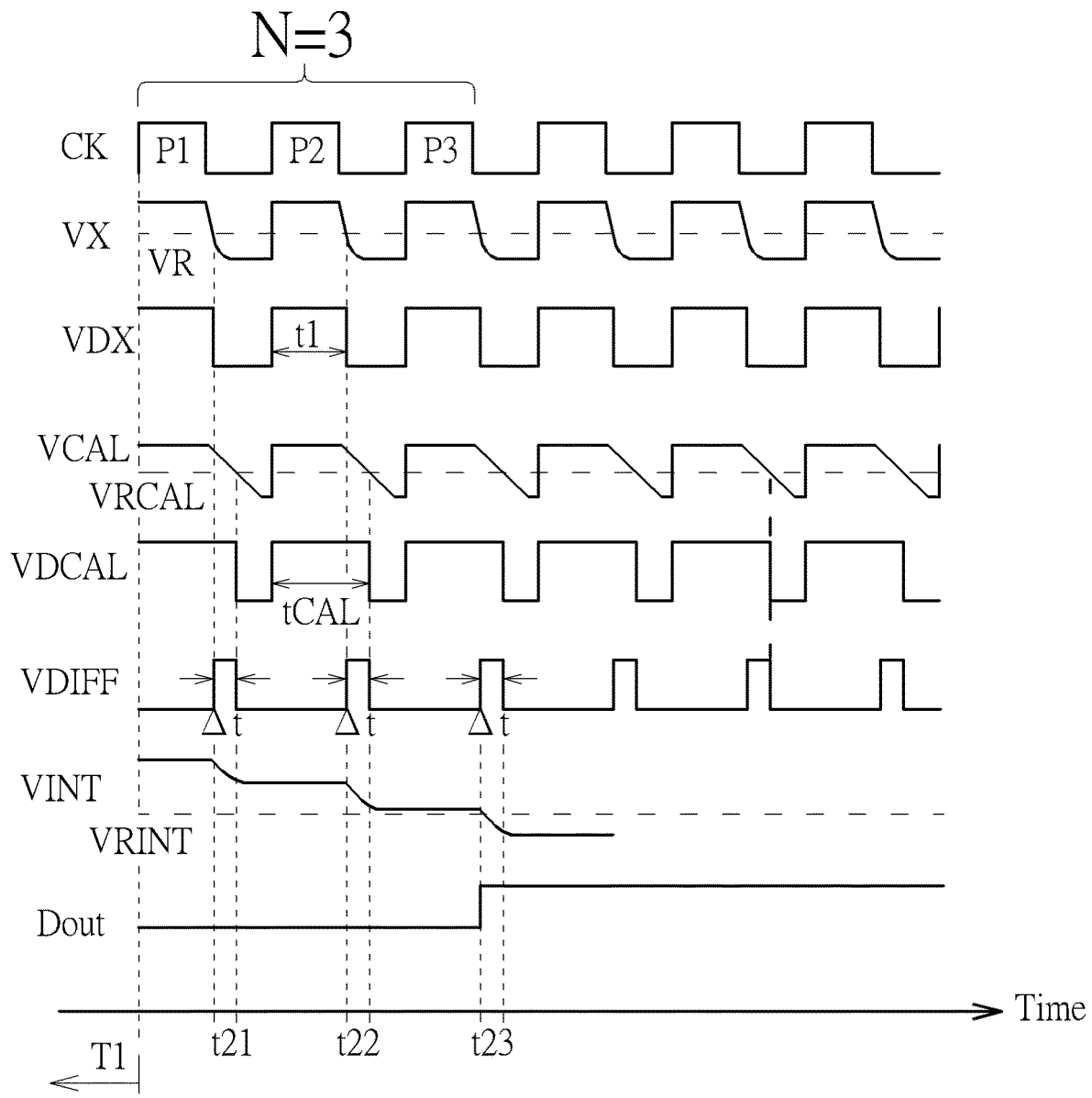
FIG. 2 and FIG. 3 are waveform diagrams related to the signals shown in FIG. 1.
Figure 3:
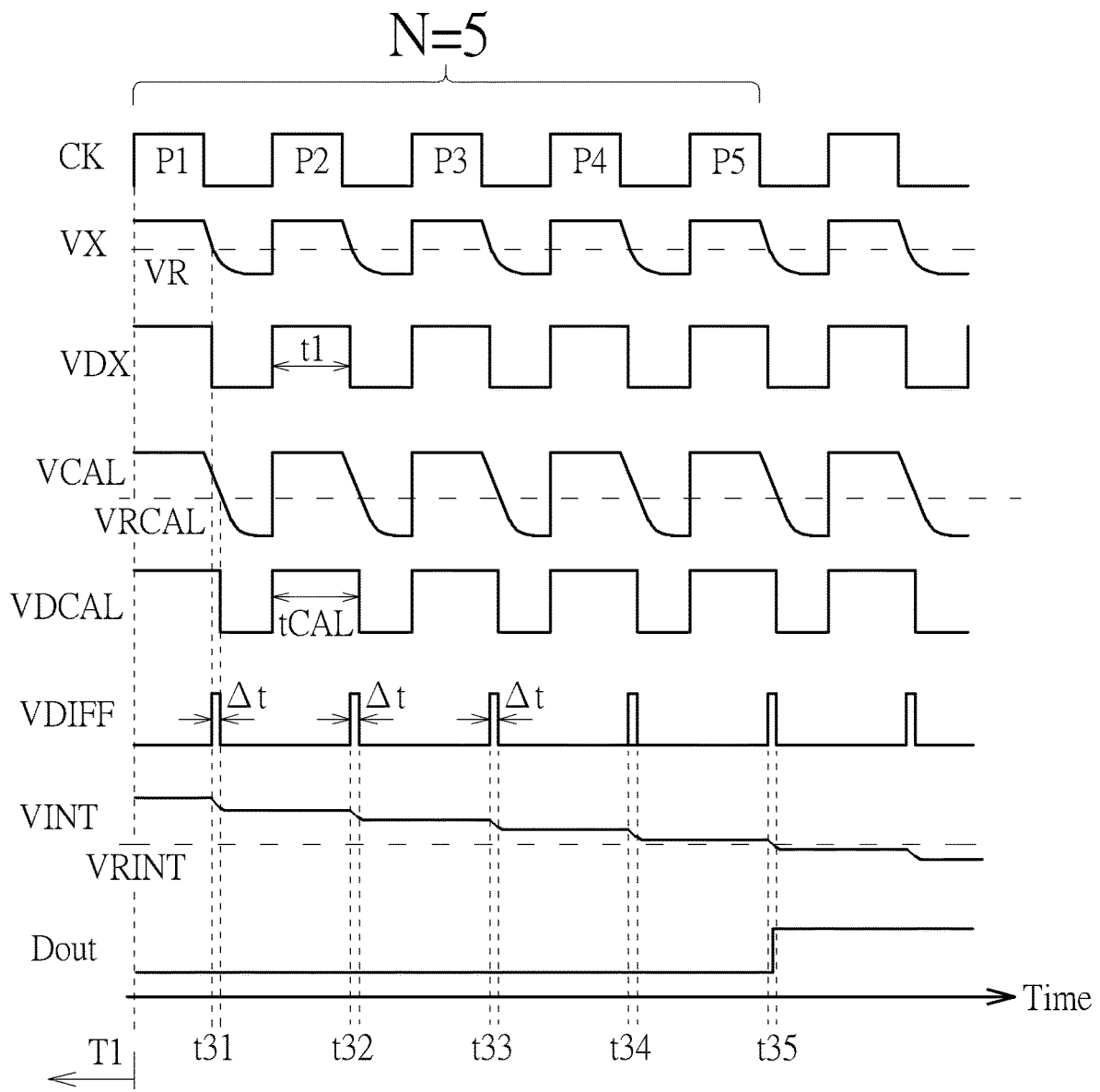

As described above, a solution is still in need to measure a characteristic (e.g., capacitance or resistance) of a passive component (e.g., capacitor, resistor or diode). In order to effectively measure the changes of the characteristic of a passive component, an embodiment can provide a measurement circuit as described below. FIG. 1 illustrates a measurement circuit 100 for measuring a passive component according to an embodiment. FIG. 2 and FIG. 3 are waveform diagrams related to the signals shown in FIG. 1.

As shown in FIG. 1, the measurement circuit 100 can include a first comparator 110, a second comparator 120, a third comparator 130, a counter 150, a first capacitor C, a second capacitor CCAL and a third capacitor CINT.

The first comparator 110 can compare a first voltage VX and a first reference voltage VR to generate a first comparison signal VDX. The second comparator 120 can compare a second voltage VCAL and a second reference voltage VRCAL to generate a second comparison signal VDCAL. The phase detector 140 can generate a difference signal VDIFF according to a phase difference between the first comparison signal VDX and the second comparison signal VDCAL. The third comparator 130 can compare a third voltage VINT and a third reference voltage VRINT to generate a third comparison signal Dout.

As shown in FIG. 2 and FIG. 3, the waveform of the difference signal VDIFF has a plurality of pulses. During the multiple pulses of the difference signal VDIFF, the third capacitor CINT can be gradually discharged, so that the third voltage VINT can gradually decrease. When the third voltage VINT drops to the third reference voltage VRINT, the third comparison signal Dout can transit to another state. In the text, when it mentions a comparator transits, it can mean the signal outputted by the comparator transits from a level to another level. The counter 150 can count number of pulses (hereinafter number N), where the number N corresponds to time for the third voltage VINT to drop to the third reference voltage VRINT. The number N can be used to obtain the characteristics of the passive component to be tested. More details will be described below.

According to an embodiment, the first voltage VX can be related to discharge of a first capacitor C. The second voltage VCAL can be related to discharge of a second capacitor CCAL. The third voltage VINT can be related to discharge of a third capacitor CINT. The third capacitor CINT can be discharged during the pulses of the difference signal VDIFF. More details are described below.

As shown in FIG. 1, according to an embodiment, the circuit 100 can further include a first resistor R and a first switch SW1. The first resistor R can be coupled to the first capacitor C in parallel to generate the first voltage VX. The first switch SW1 can be coupled between the first resistor R and a voltage source V and controlled by a clock signal CK. The first capacitor C can be charged when the first switch SW1 is turned on (conductive); and the first capacitor C can be discharged through the first resistor R when the first switch SW1 is turned off (non-conductive).

According to an embodiment, the circuit 100 can further include a second resistor RCAL and a second switch SW2. The second resistor RCAL can be coupled to the second capacitor CCAL in parallel to generate the second voltage VCAL. The second switch SW2 can be coupled between the second resistor RCAL and the voltage source V and controlled by the clock signal CK. The second capacitor CCAL can be charged when the second switch SW2 is turned on; and the second capacitor CCAL can be discharged through the second resistor RCAL when the second switch SW2 is turned off. According to an embodiment, the second resistor RCAL and the second capacitor CCAL can have known resistance and capacitance and be used for calibration.

According to an embodiment, the circuit 100 can further include a third resistor RINT, a third switch SW3 and a fourth switch SW4. The third resistor RINT can be coupled to the third capacitor CINT in parallel to generate the third voltage VINT. The third switch SW3 can be coupled between the third resistor RINT and a reference voltage VREF and be controlled by the difference signal VDIFF outputted from the phase detector 140. The reference voltage terminal VREF can be a ground terminal or an appropriate voltage terminal. The third capacitor CINT can be discharged through the third resistor RINT and the third switch SW3 when the third switch SW3 is turned on. The fourth switch SW4 can be coupled between the third resistor RINT and the voltage source V and be controlled by a control signal RST. The fourth switch SW4 can be turned on in an initial interval T1 (as shown in FIG. 2 and FIG. 3) to charge the third capacitor CINT. The fourth switch SW4 can be turned off after the initial interval T1 has elapsed.

The principle of measuring a passive component by the circuit 100 can be as follows. Assuming that the passive component to be tested is the first capacitor C shown in FIG. 1, the first resistor R can be set to have a known resistance. In the text, it is assumed that the switches can be turned on with a high level signal; in other words, the switches are assumed to be active-high. For convenience of description, in the following example, the voltage levels of the first reference voltage VR, the second reference voltage VRCAL, and the third reference voltage VRINT are equal.

When the clock signal CK is at the high level, the first capacitor C can be charged, so the first voltage VX can be charged to the level of the voltage source V. Similarly, the second voltage VCAL can be charged to the level of the voltage source V. The level of the voltage source V can also be denoted as V, and it can be expressed as VX=V and VCAL=V. At the time, since the first voltage VX is greater than the first reference voltage VR (VX>VR), the first comparison signal VDX can be at the high level; for example, it can be expressed that VDX=1.

When the clock signal is at the low level, the first voltage VX can be gradually decreased because of the discharge of the first capacitor C. The discharge can be expressed as:

$$VX = V * \exp\left(-\frac{t}{RC}\right);$$

where R can be the resistance of the first resistor R, and C can be the capacitance of the first capacitor C.

Regarding the discharge of the first capacitor C, during the interval t1, it can be expressed as:

$$t1 = R * C * \ln\left(\frac{V}{VR}\right),$$

and VDX=1 (at the high level).

Likewise, regarding the discharge of the second capacitor CCAL, during the period tCAL, $$tCAL = RCAL * CCAL * \ln\left(\frac{V}{VRCAL}\right),$$

and VDCAL=1 (at the high level).

Assuming that the first resistor R and the second resistor RCAL have the same resistance, the capacitance difference between the second capacitor CCAL and the first capacitor C is $\Delta C$, and the first reference voltage VR is equal to the second reference voltage VRCAL, it can be expressed as follows:

$R=RCAL;$ $CCAL=C-\Delta C;$ and $VR=VRCAL.$

The difference between the intervals t1 and tCAL can be expressed as:

$$t1 - tCAL = \Delta t = \Delta C * R * \ln\left(\frac{V}{VR}\right).$$

In this example, since the resistance of the first resistor R, the voltage of the voltage source V and the first reference voltage VR have been known, the time difference (i.e. phase difference) $\Delta t$ can be used to estimate the capacitance difference $\Delta C$. Then, according to the equation CCAL=C–$\Delta C$, the capacitance of the first capacitor C can be obtained since the capacitance of the second capacitor CCAL has been known.

As shown in FIG. 1, FIG. 2 and FIG. 3, the phase detector 140 can be used to obtain a phase difference $\Delta t$ between the first comparison signal VDX and the second comparison signal VDCAL to further generate the difference signal VDIFF. The width of each pulse of the difference signal VDIFF can be the phase difference $\Delta t$. According to the foresaid equations, the capacitance difference $\Delta C$ between the first capacitor C and the second capacitor CCAL can be proportional to the width of the pulse of the difference signal VDIFF $\Delta t$).

The first capacitor C and the second capacitor CCAL can be periodically charged and discharged according to the clock signal CK as shown in FIG. 2 and FIG. 3. Hence, the pulses of the difference signal VDIFF can also be periodical.

As mentioned above, the third voltage VINT can be reset to the voltage of the voltage source V by means of the charge of the third capacitor CINT in the initial interval T1. During the pulses of the difference signal VDIFF, the third capacitor CINT can be discharged to the reference voltage terminal VREF through the third resistor RINT and the third switch SW3. Hence, the third voltage VINT can decrease during the pulses of the difference signal VDIFF, and it can be expressed as:

$$VINT = V * \exp\left(-\frac{\Delta t}{RINT * CINT}\right) = V * \exp\left(-\frac{\Delta CR \ln\left(\frac{V}{VR}\right)}{RINT * CINT}\right).$$

For example, as shown in FIG. 2, since the difference signal VDIFF has pulses during the periods t21, t22 and t23, the third voltage VINT decreases during the periods. Likewise, as shown in FIG. 3, since the difference signal VDIFF has pulses during the periods t31, t32, t33, t34 and t35, the third voltage VINT decreases during the periods.

When the third voltage VINT decreases to the third reference voltage VRINT, the third comparison signal Dout outputted by the third comparator 130 can accordingly transit to another state.

As mentioned above, during the plurality of pulses of the difference signal VDIFF, the third voltage VINT can gradually decrease to the third reference voltage VRINT. If the pulse width of the difference signal VDIFF is greater, the third voltage VINT can decrease more during each pulse, and it takes a shorter time for the third voltage VINT to decrease to the third reference voltage VRINT. Otherwise, if the pulse width of the difference signal VDIFF is smaller, the third voltage VINT can decrease less during each pulse, and it takes a longer time for the third voltage VINT to decrease to the third reference voltage VRINT. Because the pulse width (i.e. the phase difference $\Delta t$) of the difference signal VDIFF is determined by the capacitance and the resistance of the first capacitor C and the first resistor R, if the time of the third voltage VINT decreasing to the third reference voltage VRINT is known, the characteristic of the passive component under test (e.g., the capacitance of the first capacitor C) can be accordingly estimated.

The counter 150 can be used to calculate the time of the third voltage VINT dropping to the third reference voltage VRINT. The counter 150 can be controlled by the clock signal CK and can count the number N of pulses of the clock signal CK. The number N corresponds to the time of the third voltage VINT dropping to the third reference voltage VRINT.

Regarding the third voltage VINT drops to the third reference voltage VRINT due to the discharge of the capacitor CINT to cause the transition of the comparator 130, if the required number of pulses of the clock signal CK is N (that is, the capacitor CINT has to be discharged N times), it can be expressed as:

$$VINT(N) = V * \exp\left(-\frac{N * \Delta t}{RINT * CINT}\right)$$

$$= V * \exp\left(-\frac{N * \Delta C * R * \ln\left(\frac{V}{VR}\right)}{RINT * CINT}\right) = VRINT.$$

Further, regarding VRINT=VR, the following equation can be derived:

$N*\Delta C*R = RINT*CINT.$

For example, as shown in FIG. 2, after the initial period T1 has elapsed, the third voltage VINT can drop to the third reference voltage VRINT after three pulses (P1, P2 and P3) of the clock signal CK.

As shown in FIG. 3, after the initial period T1 has elapsed, the third voltage VINT can drop to the third reference voltage VRINT after five pulses (P1, P2, P3, P4 and P5) of the clock signal CK.

In this example, since the characteristics of the first resistor R, the third resistor RINT, the third capacitor CINT and the second capacitor CCAL are known, the time of waiting for the comparator 130 to transit can be obtained according to the number N of pulses. Therefore, the capacitance difference $\Delta C$ between the capacitors CCAL and C can be calculated. Then, according to the equation CCAL=C−$\Delta C$, the capacitance of the capacitor C under test can be obtained.

As described above, when the resistance of the first resistor R is known, the number N can be used to calculate the capacitance of the first capacitor C, and the capacitance of the first capacitor C is smaller when the number N is greater.

When the capacitance difference $\Delta C$ is greater, the pulse width of the difference signal VDIFF is greater, and it takes fewer periods of the clock signal CK for the voltage VINT to drop to the reference voltage VRINT through discharge of the third capacitor CINT. In other words, the number N of pulses can be smaller. In this scenario, the capacitance of the first capacitor C can be greater.

When the capacitance difference $\Delta C$ is smaller, the pulse width of the difference signal VDIFF is smaller. The third capacitor CINT is discharged less each time, so it takes more periods of the clock signal CK for the voltage VINT to drop to the reference voltage VRINT through discharge of the third capacitor CINT. In other words, the number N of pulses can be greater. In this scenario, the capacitance of the first capacitor C can be smaller.

In other words, the product of the number N of pulses and the pulse width of the difference signal VDIFF (i.e. the phase difference $\Delta t$) can be a constant. Hence, when the phase difference $\Delta t$ is greater, the needed number N of pulses can be smaller.

Regarding the phase, in different conditions, one of the waveforms of the voltages VX and VCAL can lead the other one. The output of the phase detector 140 can provide the information that which signal leads the other signal, so the system can analyze whether the capacitance difference $\Delta C$ is a positive value or a negative value for subsequent analysis.

In the foresaid example, it is assumed the resistor R is known, and the number N of pulses is used to calculate the capacitance of the unknown capacitor C. However, if the resistor R is unknown and the capacitor is known, the number N of pulses can be used to calculate the resistance of the resistor R by means of the analysis described above. For example, if the passive component under test is a diode, the abovementioned principles can be used to obtain the resistance and the current of the diode.

Figure 4:
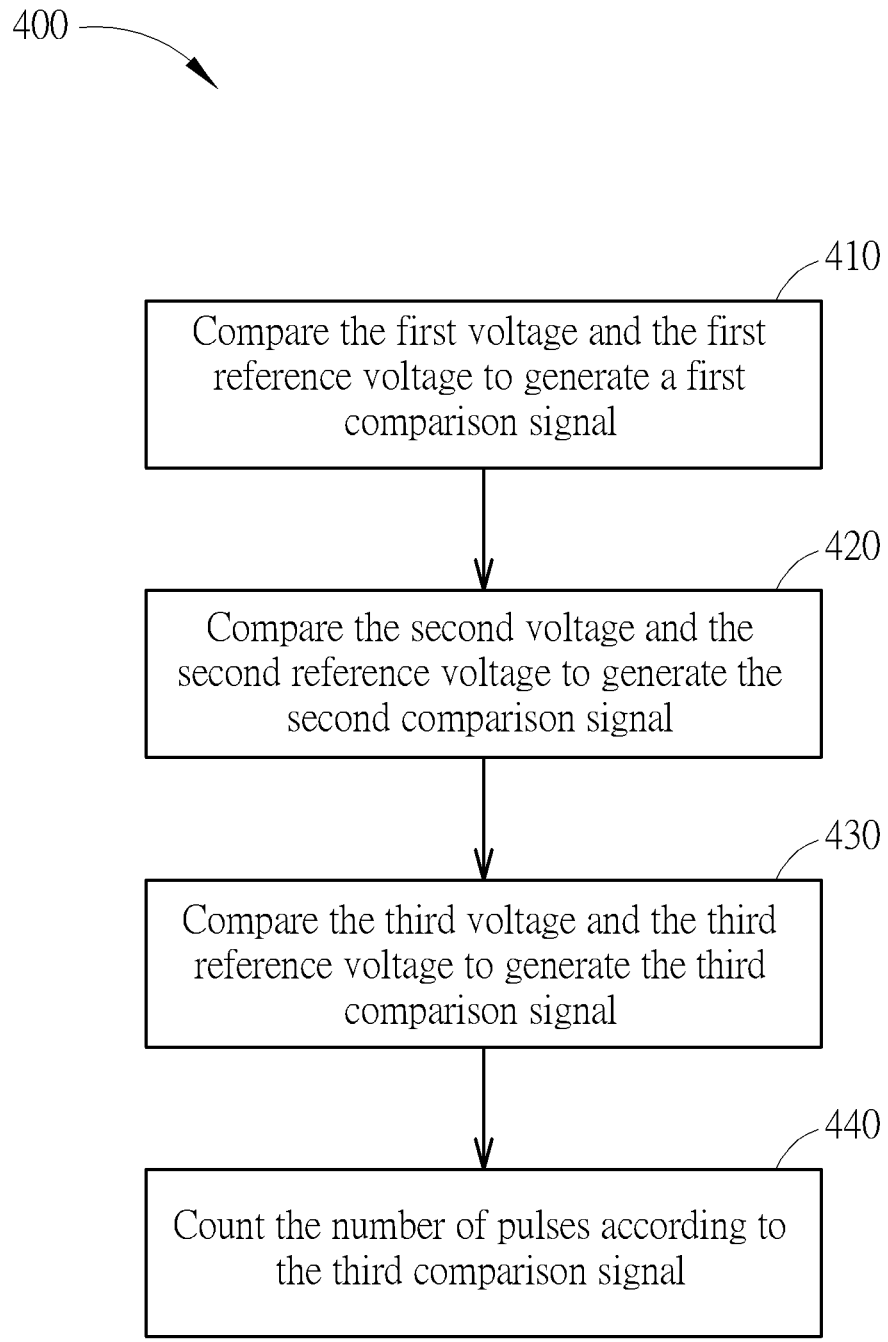
FIG. 4 is a flowchart of a method for measuring a passive component according to an embodiment.

FIG. 4 is a flowchart of a method 400 for measuring a passive component according to an embodiment. If the measurement circuit 100 of FIG. 1 is taken as an example, the method 400 can include following steps.

Step 410: compare the first voltage VX and the first reference voltage VR to generate a first comparison signal VDX;

Step 420: compare the second voltage VCAL and the second reference voltage VRCAL to generate the second comparison signal VDCAL;

Step 430: compare the third voltage VINT and the third reference voltage VRINT to generate the third comparison signal Dout; and Step 440: count the number N of pulses according to the third comparison signal Dout.

The number N of pulses can correspond to time for the third voltage VINT to drop to the third reference voltage VRINT, and the first comparison signal VR and the second comparison signal VDCAL can be used to control the drop of the third voltage VINT. The passive component to be measured and tested can be the first resistor R or the first capacitor C as mentioned above.

In summary, the measurement circuit 100 provided by an embodiment can be an effective solution for measuring characteristic(s) such as resistance and/or capacitance of a passive component. Regarding practical applications, the circuit 100 can be used for capacitive or resistive touch. Because the resistance and/or the capacitance can be changed after being touched, by setting an appropriate reference resistor and/or capacitor, it can be measured if the device is touched or not using the circuit 100. For example, regarding capacitive fingerprint recognition, the unevenness of the fingerprint can correspond to different capacitances. Regarding optical fingerprint recognition, the light sensitive effect of the photosensitive component can be similar to the effect of a resistor. Hence, the circuit 100 can be used to measure and detect the touch. The solution provided by embodiments can be used to deal with problems in the field.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for measuring a passive component, comprising:
    a first comparator configured to compare a first voltage and a first reference voltage to generate a first comparison signal;
    a second comparator configured to compare a second voltage and a second reference voltage to generate a second comparison signal;
    a third comparator configured to compare a third voltage and a third reference voltage to generate a third comparison signal; and
    a counter configured to count a number of pulses according to the third comparison signal;
    wherein the number of pulses corresponds to time for the third voltage to drop to the third reference voltage, and the first comparison signal and the second comparison signal are used to control drop of the third voltage.

2. The circuit of claim 1, further comprising:
a phase detector configured to generate a difference signal according to a phase difference between the first comparison signal and the second comparison signal;
    wherein the third voltage drops during a pulse of the difference signal.

3. The circuit of claim 1, wherein the first voltage is related to discharge of a first capacitor, and the number of pulses is used to calculate a capacitance of the first capacitor.

4. The circuit of claim 1, wherein the first voltage is related to discharge of a first capacitor, the first capacitor is coupled to a first resistor in parallel, and the number of pulses is used to calculate a resistance of the first resistor.

5. The circuit of claim 1, wherein the first voltage is related to discharge of a first capacitor, the first capacitor is coupled to a first resistor in parallel to generate the first voltage, and the circuit further comprises:
    a first switch coupled between the first resistor and a voltage source and controlled by a clock signal;
    wherein the first capacitor is charged when the first switch is turned on, and the first capacitor is discharged through the first resistor when the first switch is turned off.

6. The circuit of claim 1, wherein the second voltage is related to discharge of a second capacitor, the second capacitor is coupled to a second resistor in parallel to generate the second voltage, and the circuit further comprises:
    a second switch coupled between the second resistor and a voltage source and controlled by a clock signal;
    wherein the second capacitor is charged when the second switch is turned on, and the second capacitor is discharged through the second resistor when the second switch is turned off.

7. The circuit of claim 1, wherein the third voltage is related to discharge of a third capacitor, the third capacitor is coupled to a third resistor in parallel to generate the third voltage, and the circuit further comprises:
    a third switch coupled to the third resistor and controlled by a difference signal;
    wherein the difference signal is generated according to a phase difference between the first comparison signal and the second comparison signal, and the third capacitor is discharged through the third resistor and the third switch when the third switch is turned on.

8. The circuit of claim 7, further comprising:
    a fourth switch coupled between the third resistor and a voltage source;
    wherein the fourth switch is turned on in an initial interval to charge the third capacitor, and the fourth switch is turned off after the initial interval has elapsed.

9. The circuit of claim 1, wherein a difference signal is generated according to a phase difference between the first comparison signal and the second comparison signal, and a product of the number of pulses and a width of a pulse of the difference signal is a constant.

10. The circuit of claim 1, wherein the first voltage is related to discharge of a first capacitor, the second voltage is related to discharge of a second capacitor, a difference signal is generated according to a phase difference between the first comparison signal and the second comparison signal, and a capacitance difference between the first capacitor and the second capacitor is proportional to a width of a pulse of the difference signal.

11. A method for measuring a passive component, comprising:
    comparing a first voltage and a first reference voltage to generate a first comparison signal;
    comparing a second voltage and a second reference voltage to generate a second comparison signal;
    comparing a third voltage and a third reference voltage to generate a third comparison signal; and
    counting a number of pulses according to the third comparison signal;
    wherein the number of pulses corresponds to time for the third voltage to drop to the third reference voltage, and the first comparison signal and the second comparison signal are used to control drop of the third voltage.

12. The method of claim 11, further comprising:
    generating a difference signal according to a phase difference between the first comparison signal and the second comparison signal;

wherein the third voltage drops during a pulse of the difference signal.

13. The method of claim 11, wherein the first voltage is related to discharge of a first capacitor, and the method further comprises:
calculating a capacitance of the first capacitor using the number of pulses.

14. The method of claim 11, wherein the first voltage is related to discharge of a first capacitor, the first capacitor is coupled to a first resistor in parallel, and the method further comprises:
calculating a resistance of the first resistor using the number of pulses.

15. The method of claim 11, wherein the first voltage is related to discharge of a first capacitor, the first capacitor is coupled to a first resistor in parallel to generate the first voltage, and the method further comprises:
controlling a first switch coupled between the first resistor and a voltage source by a clock signal;
wherein the first capacitor is charged when the first switch is turned on, and the first capacitor is discharged through the first resistor when the first switch is turned off.

16. The method of claim 11, wherein the second voltage is related to discharge of a second capacitor, the second capacitor is coupled to a second resistor in parallel to generate the second voltage, and the method further comprises:
controlling a second switch coupled between the second resistor and a voltage source by a clock signal;
wherein the second capacitor is charged when the second switch is turned on, and the second capacitor is discharged through the second resistor when the second switch is turned off.

17. The method of claim 11, wherein the third voltage is related to discharge of a third capacitor, the third capacitor is coupled to a third resistor in parallel to generate the third voltage, and the method further comprises:
controlling a third switch coupled to the third resistor by a difference signal;
wherein the difference signal is generated according to a phase difference between the first comparison signal and the second comparison signal, and the third capacitor is discharged through the third resistor and the third switch when the third switch is turned on.

18. The method of claim 17, further comprising:
controlling a fourth switch coupled between the third resistor and a voltage source;
wherein the fourth switch is turned on in an initial interval to charge the third capacitor, and the fourth switch is turned off after the initial interval has elapsed.

19. The method of claim 11, further comprising:
generating a difference signal according to a phase difference between the first comparison signal and the second comparison signal;
wherein a product of the number of pulses and a width of a pulse of the difference signal is a constant.

20. The method of claim 11, further comprising:
generating a difference signal according to a phase difference between the first comparison signal and the second comparison signal;
wherein the first voltage is related to discharge of a first capacitor, the second voltage is related to discharge of a second capacitor, and a capacitance difference between the first capacitor and the second capacitor is proportional to a width of a pulse of the difference signal.

* * * * *